US012454753B2

(12) United States Patent
Li et al.

(10) Patent No.: US 12,454,753 B2
(45) Date of Patent: Oct. 28, 2025

(54) COMPOSITIONS AND METHODS USING SAME FOR DEPOSITION OF SILICON-CONTAINING FILM

(71) Applicant: Versum Materials US, LLC, Tempe, AZ (US)

(72) Inventors: Jianheng Li, Tempe, AZ (US); Xinjian Lei, Tempe, AZ (US); Robert G. Ridgeway, Tempe, AZ (US); Raymond N. Vrtis, Tempe, AZ (US); Manchao Xiao, Tempe, AZ (US); Richard Ho, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 137 days.

(21) Appl. No.: 17/085,793

(22) Filed: Oct. 30, 2020

(65) Prior Publication Data
US 2021/0140040 A1 May 13, 2021

Related U.S. Application Data

(62) Division of application No. 16/062,935, filed on Jun. 15, 2018, now abandoned.

(51) Int. Cl.
| | | |
|---|---|---|
| *C23C 16/34* | (2006.01) | |
| *C07F 7/10* | (2006.01) | |
| *C07F 7/18* | (2006.01) | |
| *C23C 16/04* | (2006.01) | |
| *C23C 16/36* | (2006.01) | |

(Continued)

(52) U.S. Cl.
CPC .............. *C23C 16/345* (2013.01); *C07F 7/10* (2013.01); *C07F 7/1804* (2013.01); *C23C 16/045* (2013.01); *C23C 16/36* (2013.01); *C23C 16/401* (2013.01); *C23C 16/50* (2013.01)

(58) Field of Classification Search
CPC ...... C23C 16/401; C23C 16/36; C23C 16/345
See application file for complete search history.

(56) References Cited

U.S. PATENT DOCUMENTS

| | | |
|---|---|---|
| 7,074,690 B1 | 7/2006 | Gauri et al. |
| 7,498,273 B2 | 3/2009 | Mallick et al. |
| 7,521,378 B2 | 4/2009 | Fucsko et al. |

(Continued)

FOREIGN PATENT DOCUMENTS

| | | |
|---|---|---|
| CN | 103582719 A | 2/2014 |
| CN | 104962877 A | 10/2015 |

(Continued)

OTHER PUBLICATIONS

Kim, et al., "Novel Flowable CVD Process Technology for sub-20nm Interlayer Dielectrics" International Interconnect Technology Conference (IITC), Institute of Electrical and Electronics Engineers / IEEE International, 2012, San Jose, CA (3 pages).

*Primary Examiner* — Joseph A Miller, Jr.
(74) *Attorney, Agent, or Firm* — Daniel Roth

(57) ABSTRACT

Described herein are compositions and methods using same for forming a silicon-containing film such as without limitation a silicon oxide, silicon nitride, silicon oxynitride, a carbon-doped silicon nitride, or a carbon-doped silicon oxide film on at least a surface of a substrate having a surface feature. In one aspect, the silicon-containing films are deposited using a compound having Formula I or II described herein.

7 Claims, 3 Drawing Sheets

(51) Int. Cl.
*C23C 16/40* (2006.01)
*C23C 16/50* (2006.01)

(56) References Cited

U.S. PATENT DOCUMENTS

| | | |
|---|---|---|
| 7,557,420 B2 | 7/2009 | Fucsko et al. |
| 7,582,555 B1 | 9/2009 | Lang et al. |
| 7,825,040 B1 | 11/2010 | Fukazawa et al. |
| 7,888,233 B1 | 2/2011 | Gauri et al. |
| 7,915,131 B2 | 3/2011 | Nakagawa et al. |
| 8,481,403 B1 | 7/2013 | Gauri et al. |
| 8,575,040 B2 | 11/2013 | Fucsko et al. |
| 8,580,697 B1 | 11/2013 | Lang et al. |
| 8,685,867 B1 | 4/2014 | Danek et al. |
| 2002/0142585 A1 | 10/2002 | Mandal |
| 2003/0054102 A1 | 3/2003 | Horikawa |
| 2004/0096582 A1 | 5/2004 | Wang et al. |
| 2005/0163927 A1 | 7/2005 | McSwiney et al. |
| 2010/0029972 A1 | 2/2010 | Jandke et al. |
| 2012/0276713 A1 | 11/2012 | Miyahara et al. |
| 2013/0217241 A1 | 8/2013 | Underwood et al. |
| 2013/0230987 A1 | 9/2013 | Draeger et al. |
| 2014/0073144 A1 | 3/2014 | Chatterjee et al. |
| 2014/0302688 A1 | 10/2014 | Underwood et al. |
| 2015/0275355 A1 | 10/2015 | Mallikarjunan et al. |

FOREIGN PATENT DOCUMENTS

| | | |
|---|---|---|
| EP | 2714960 A2 | 4/2014 |
| EP | 2644609 | 7/2015 |
| JP | 2006-517517 | 7/2006 |
| JP | 2009-539268 | 11/2009 |
| JP | 2010-516723 | 5/2010 |
| JP | 2011-504651 | 2/2011 |
| JP | 2013-533639 | 7/2011 |
| JP | 2012-231007 | 11/2012 |
| JP | 2013-545284 | 12/2013 |
| JP | 2015-188087 | 10/2015 |
| KR | 10-2014-0105701 | 9/2014 |
| KR | 10-2015-0090883 | 8/2015 |
| WO | 2008048862 A2 | 4/2008 |
| WO | 2011084223 A2 | 7/2011 |
| WO | 2012015610 | 2/2012 |
| WO | 2015/105350 | 8/2015 |
| WO | WO2016-065219 * | 4/2016 |

* cited by examiner

COMPOSITIONS AND METHODS USING SAME FOR DEPOSITION OF SILICON-CONTAINING FILM

CROSS-REFERENCE TO RELATED APPLICATIONS

This application is a Divisional of U.S. patent application Ser. No. 16/062,935, filed Jun. 15, 2018, which is a U.S. National Stage entry of International Patent Application No. PCT/US2016/067935, filed on Dec. 21 2016, which claims the benefit of priority to U.S. Application No. 62/270,259, filed on Dec. 21, 2015 , the disclosures of which are hereby incorporated by reference in their entirely.

FIELD OF THE INVENTION

Described herein is a process for the fabrication of an electronic device. More specifically, described herein are compositions for forming a silicon-containing film in a deposition process, such as, without limitation, a flowable chemical vapor deposition.

Exemplary silicon-containing films that can be deposited using the compositions and methods described herein include, without limitation, silicon oxide, silicon nitride, silicon oxynitride or carbon-doped silicon oxide or carbon-doped silicon nitride films.

BACKGROUND OF THE INVENTION

Flowable oxide deposition methods typically use alkoxysilane compounds as precursors for silicon-containing films which are deposited by controlled hydrolysis and condensation reactions. Such films can be deposited onto a substrate, for example, by applying a mixture of oxidant and alkoxysilanes, optionally with solvent and/or other additives such as surfactants and porogens, onto a substrate. Typical methods for the application of these mixtures include, without limitation, spin coating, dip coating, spray coating, screen printing, co-condensation, and ink jet printing. After application to the substrate and upon application of one or more energy sources such as, without limitation thermal, plasma, and/or other sources, the water within the mixture can react with the alkoxysilanes to hydrolyze the alkoxide and/or aryloxide groups and generate silanol species, which further condense with other hydrolyzed molecules and form an oligomeric or network structure.

Besides physical deposition or application of the precursor to the substrate, vapor deposition processes using oxidant and a silicon containing vapor source for flowable dielectric deposition (FCVD) have been described, for instance, in U.S. Pat. Nos. 8,481,403; 8,580,697; 8,685,867; US Publ. No. 2013/0230987 A1; U.S. Pat. Nos. 7,498,273; 7,074,690; 7,582,555; 7,888,233; and 7,915,131. Typical methods generally relate to filling gaps on substrates with a solid dielectric material by forming a flowable film in the gap. The flowable film is formed by reacting a dielectric precursor which may have a Si—C bond with an oxidant to form the dielectric material. In certain embodiments, the dielectric precursor condenses and subsequently reacts with the oxidant to form dielectric material. In certain embodiments, vapor phase reactants react to form a condensed flowable film. Since the Si—C bond is relatively inert towards reaction with water, the resultant network may be beneficially functionalized with organic functional groups which impart desired chemical and physical properties to the resultant film. For example, the addition of carbon to the network may lower the dielectric constant of the resultant film.

Another approach to depositing a silicon oxide film using flowable chemical vapor deposition process is gas phase polymerization. For example, the prior art has focused on using compounds such as trisilylamine (TSA) to deposit Si, H, N containing oligomers that are subsequently oxidized to SiOx films using ozone exposure. Examples of such approaches include: U. S. Publ. No. 2014/073144; U. S. Publ. No. 2013/230987; U.S. Pat. Nos. 7,521,378, U.S. Pat. Nos. 7,557,420, and 8,575,040; and 7,825,040.

The reference article "Novel Flowable CVD Process Technology for sub-20 nm Interlayer Dielectric", H. Kim et al., Interconnect Technology Conference (IITC), 2012 IEEE International, San Jose, CA describes a flowable CVD process using remote plasma during low temperature deposition and ozone treatment to stabilize the film. Also described in the reference was a flowable CVD process which does not oxidize Si or electrode, resulted in removal of $Si_3N_4$ stopper layer as an oxidation or diffusion barrier. After the application of Flowable CVD to 20 nm DRAM ILD, the authors could reduce not only loading capacitance of Bit-line by 15% but also enhance comparable productivity. Through the successful development of sub-20 nm DRAM ILD Gap-fill process, Flowable CVD was successful demonstrated as a promising candidate for mass production-worthy ILD in sub-20 nm next generation devices.

US Publ. No. 2013/0217241 discloses the deposition and treatment of Si—C—N containing flowable layers. Si and C may come from a Si—C-containing precursor, while N may come from an N-containing precursor. The initial Si—C—N containing flowable layer is treated to remove components that enables the flowability. Removal of these components can increase etch tolerance, reduce shrinkage, adjust film tension and electrical properties. The post treatment can be thermal annealing, UV exposure or high density plasma.

The disclosure of the previously identified patents, patent applications and publications is hereby incorporated by reference.

Despite the recent activity in the art related to flowable chemical vapor deposition and other film deposition processes, problems still remain. One of these problems is related to film composition. For example, flowable oxide films deposited from the precursor trisilylamine (TSA) in a gas phase polymerization process yield films and have a wet etch rates in dilute HF solutions that are 2.2 to 2.5 times faster than high quality thermal oxide. Thus, there is a need to provide alternative precursor compounds to produce silicon-containing films with a lower film etch rate. There is also a need for new precursors to deposit carbon doped silicon nitride films and improve film stability as well as wet etch rate of the films. However, many of these precursors contain substantial amount of carbon that is not easy to remove. The removal of excessive carbon always leads to the formation of voids. Therefore, new precursors need to be designed and synthesized so that excessive carbon can be eliminated without creating voids.

BRIEF SUMMARY OF THE INVENTION

The instant invention solves problems with conventional organosilicon compounds and methods by providing new precursor compounds, methods for depositing films and resultant silicon containing films. The inventive silicon containing films can have tert-butyl, tert-butoxy groups or other similar bonds that are easily removed by plasma, thermal and UV treatment. The resultant film yields excellent gap-fill in different features.

The compositions or formulations described herein and methods using same overcome the problems of the prior art by depositing a silicon-containing film on at least a portion of the substrate surface that provides desirable film properties upon post-deposition treatment with an oxygen-containing source. In certain embodiments, the substrate comprises a surface feature. The term "surface feature", as used herein, means that the substrate comprises one or more of the following pores, trenches, shallow trench isolation (STI), vias, re-entrant feature, or the like. The compositions can be pre-mixed compositions, pre-mixtures (mixed before being used in the deposition process), or in-situ mixtures (mixed during the deposition process). Thus, in this disclosure the terms "mixture", "formulation", and "composition" are interchangeable.

In one aspect of the invention, the inventive silicon containing film has no voids or defects (e.g., as determined by SEM described below in greater detail). The inventive silicon containing film can contact a surface feature with a void or defect free film and, if desired, at least partially fill a gap, cover a via, among other surface features.

In one aspect, there is provided a method for depositing a silicon-containing film, the method comprising:
placing a substrate having a surface feature into a reactor which are maintained at a temperature ranging from −20° C. to about 400° C.;
introducing into the reactor at least one compound selected from the group consisting of Formulae I or II below:

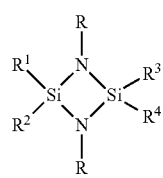

I

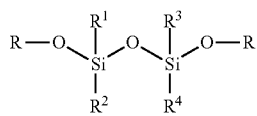

II wherein R is selected from a branched $C_4$ to $C_{10}$ alkyl group; $R^1$, $R^2$, $R^3$, $R^4$ are each independently selected from a hydrogen atom, a linear $C_1$ to $C_{10}$ alkyl group, a branched $C_3$ to $C_{10}$ alkyl group, a linear or branched $C_2$ to $C_6$ alkenyl group, a linear or branched $C_2$ to $C_6$ alkynyl group, a $C_1$ to $C_6$ dialkylamino group, a $C_6$ to $C_{10}$ aryl group, an electron withdrawing group, a $C_3$ to $C_{10}$ cyclic alkyl group, and a halide atom; and a nitrogen source wherein the at least one compound reacts with the nitrogen source to form a nitride containing film on at least a portion of the surface feature; and
treating the substrate with an oxygen source at one or more temperatures ranging from about 100° C. to about 1000° C. to form the film on at least a portion of the surface feature. In one embodiment, the silicon-containing film is selected from a silicon oxide or a carbon-doped silicon oxide film. In this or another embodiment, the film is exposed to an oxygen source during at least a portion of the time it is exposed to UV irradiation at temperatures ranging from about 100° C. to about 1000° C. The method steps can be repeated until the surface features are filled with the film.

In another aspect, there is provided a method for depositing a silicon-containing film, the method comprising:
placing a substrate comprising a surface feature into a reactor wherein the substrate is maintained at one or more temperatures ranging from about −20° C. to about 400° C. and a pressure of the reactor is maintained at 100 torr or less;
introducing at least one compound selected from the group consisting of Formulae I or II below:

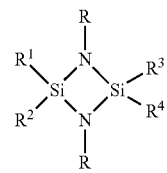

I

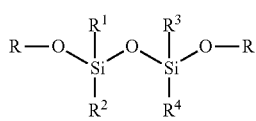

II wherein R is selected from a branched $C_4$ to $C_{10}$ alkyl group and $R^1$, $R^2$, $R^3$, $R^4$ are each independently selected from a hydrogen atom, a linear $C_1$ to $C_{10}$ alkyl group, a branched $C_3$ to $C_{10}$ alkyl group, a linear or branched $C_2$ to $C_6$ alkenyl group, a linear or branched $C_2$ to $C_6$ alkynyl group, a $C_1$ to $C_6$ dialkylamino group, a $C_6$ to $C_{10}$ aryl group, an electron withdrawing group, a $C_3$ to $C_{10}$ cyclic alkyl group, and a halide atom;
providing an oxygen source into the reactor to react with the at least one compound to form a film and cover at least a portion of the surface feature;
annealing the film at one or more temperatures of about 100° C. to 1000° C. to coat at least a portion of the surface feature; and
treating the substrate with an oxygen source at one or more temperatures ranging from about 20° C. to about 1000° C. to form a silicon-containing film on at least a portion of the surface feature. In certain embodiments, the oxygen source is selected from the group consisting of water vapors, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof. In this or other embodiments, the method steps are repeated until the surface features are filled with the silicon-containing film. In embodiments wherein water vapor is employed as an oxygen source, the substrate temperature ranges from about −20° C. to about 40° C. or from about −10° C. to about 25° C.

In another aspect, there is provided a method for depositing a silicon-containing film selected from the group consisting of a silicon nitride, a carbon-doped silicon nitride, a silicon oxynitride, and a carbon-doped silicon oxynitride film, the method comprising:
placing a substrate comprising a surface feature into a reactor which is heated to a temperature ranging from −20° C. to about 400° C. and maintained at a pressure of 100 torr or less;

introducing into the reactor at least one compound selected from the group consisting of Formula I or II below:

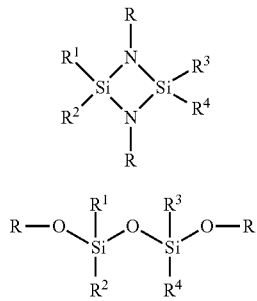

wherein R is selected from a branched $C_4$ to $C_{10}$ alkyl group and $R^1$, $R^2$, $R^3$, $R^4$ are each independently selected from a hydrogen atom, a linear $C_1$ to $C_{10}$ alkyl group, a branched $C_3$ to $C_{10}$ alkyl group, a linear or branched $C_2$ to $C_6$ alkenyl group, a linear or branched $C_2$ to $C_6$ alkynyl group, a $C_1$ to $C_6$ dialkylamino group, a $C_6$ to $C_{10}$ aryl group, an electron withdrawing group, a $C_3$ to $C_{10}$ cyclic alkyl group, and a halide atom;
providing a plasma source into the reactor to react with the compound to form a coating on at least a portion of the surface features; and
annealing the coating at one or more temperatures ranging from about 100° C. to 1000° C., or from about 100° to 400° C., to form a silicon-containing film on at least a portion of the surface features. In one particular embodiment, the plasma source is selected from the group consisting of a nitrogen plasma; plasma comprising nitrogen and helium; a plasma comprising nitrogen and argon; an ammonia plasma; a plasma comprising ammonia and helium; a plasma comprising ammonia and argon; helium plasma; argon plasma; hydrogen plasma; a plasma comprising hydrogen and helium; a plasma comprising hydrogen and argon; a plasma comprising ammonia and hydrogen; an organic amine plasma; and mixtures thereof. For flowable plasma enhanced CVD method, the steps can be repeated until the surface feature are filled with the densified film(s).

One aspect of the invention relates to any of the foregoing aspects wherein the compound comprises 1,3-bis(tert-butyl)-2-methylcyclodisilazane.

Another aspect of the invention relates to any of the foregoing aspects wherein the compound comprises 1,3-bis(tert-butoxy)-1,3-dimethyldisiloxane.

A further aspect of the invention relates to a silicon containing film formed by any of the methods.

The various aspects of the invention can be used alone or in combinations with each other.

DETAILED DESCRIPTION OF THE INVENTION

Figure 1:
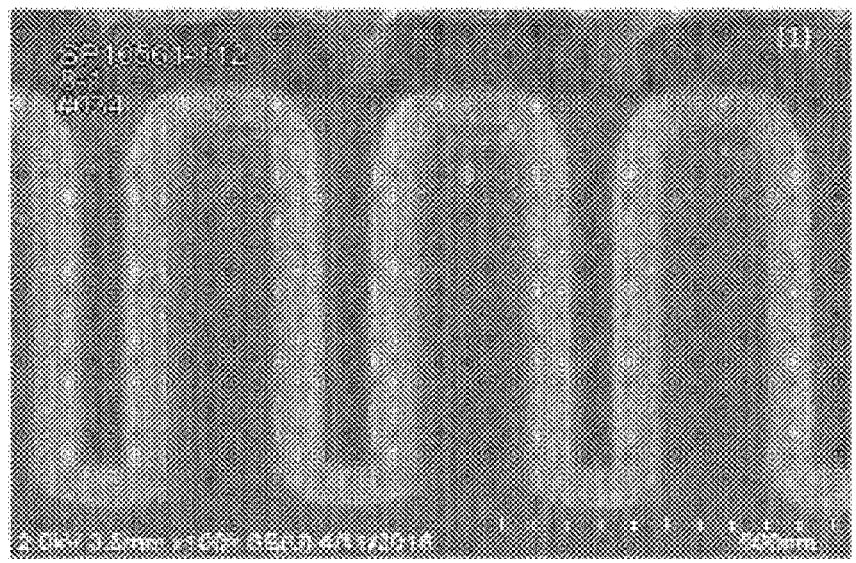
FIG. 1 provides a cross-sectional, scanning electron microscopy (SEM) image on the silicon carbonitride film deposited in Example 1.

Described herein are precursors and methods using same to deposit a flowable film via a chemical vapor deposition (CVD) process on at least a portion of a substrate. In certain embodiments, the substrate comprises one or more surface features. The surface feature(s) have a width of 1 μm in width or less, or 500 nm in width or less, or 50 nm in width or less, or 10 nm in width. In this or other embodiments, the aspect ratio (the depth to width ratio) of the surface features, if present, is 0.1:1 or greater, or 1:1 or greater, or 10:1 or greater, or 20:1 or greater, or 40:1 or greater.

Certain prior art processes use the precursor trisilylamine (TSA), which is delivered into the reaction chamber as a gas, mixed with ammonia, and activated in a remote plasma reactor to generate $NH_2$, NH, H and or N radicals or ions. The TSA reacts with the plasma activated ammonia and begins to oligomerize to form higher molecular weight TSA dimers and trimers or other species which contain Si, N and H. The substrate is placed in the reactor and cooled to one or more temperatures ranging from about 0 to about 50° C. at a certain chamber pressures and TSA/activated ammonia mixtures the oligomers begin to condense on the wafers surface in such a way that they can "flow" to fill the trench surface feature. In this way, a material which contains Si, N and H is deposited onto the wafer and fills the trench. However, such prior art processes are undesirable as there is a need to minimize the Si—H content as it is generally difficult to fully oxidize the dense films utilizing ozone and the residual Si—H content also causes increases in wet etch rates. Thus, there is a need in the art to provide a method and composition that minimizes film shrinking, lowers tensile stress, minimizes the Si—H content, and/or does not adversely affect the film's wet etch rate.

The method and composition described herein accomplishes one or more of the following objectives. In certain embodiments, the method and composition described herein involve precursor compounds that have minimal number of Si—C bonds because these bonds are difficult to completely remove in the step to form silicon nitride film, and importantly any residual Si—C bonds associated with organic fragments may cause film shrinkage in the densification step, and/or cause defects or voids in the densified films. In this or other embodiments, the method and composition described herein further reduce the Si—H content of the film by increasing the ratio of hetero atom (i.e. oxygen or nitrogen) to silicon, by introducing ring structures or siloxane increasing the ratio of silicon to hydrogen in the precursor. In some embodiments for the silicon nitride or silicon carbonitride deposition, the method and composition described herein involve precursor compounds that have better organic leaving group such as tert-butyl or tert-pentyl that are easy to remove during formation of silicon nitride or silicon oxide films. In addition, the method and composition described herein helps to control the oligomerization process (e.g., the introducing step of the method wherein the silicon nitride film is formed) by using a precursor compound that has a boiling point higher than TSA which might be condensed onto the wafer surface as a monomer and then polymerized on the surface using for example a nitrogen-based plasma, such as an ammonia $NH_3$ or a plasma comprising hydrogen and nitrogen. The inventive precursor compounds can have a boiling point of greater than about 100° C. and typically at least about 100° C. to about 150° C., and in some cases about 150° C. to about 200° C.

In some embodiments of silicon oxide film deposition, the method and composition described herein involve precursor compounds that have Si—O—Si linkage which may help formation of silicon oxide network during flowable chemical vapor deposition process.

In certain embodiments of the method, a pulsed process can be used to slowly grow the silicon nitride film thickness by alternating condensation and plasma polymerization. In these embodiments, the pulsed process grows a thinner film (e.g., 10 nanometers (nm) or less) that may produce a denser silicon containing film in the treating step.

In certain embodiments, the composition described herein comprises: at least one compound selected from the group consisting of Formulae I or II below:

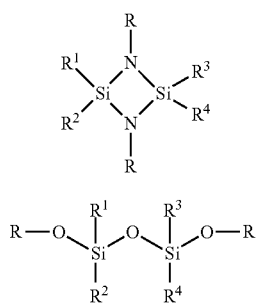

wherein R is selected from a branched $C_4$ to $C_{10}$ alkyl group and $R^1$, $R^2$, $R^3$, $R^4$ are each independently selected from a hydrogen atom, a linear $C_1$ to $C_{10}$ alkyl group, a branched $C_3$ to $C_{10}$ alkyl group, a linear or branched $C_2$ to $C_6$ alkenyl group, a linear or branched $C_2$ to $C_6$ alkynyl group, a $C_1$ to $C_6$ dialkylamino group, a $C_6$ to $C_{10}$ aryl group, an electron withdrawing group, a $C_3$ to $C_{10}$ cyclic alkyl group, and a halide atom.

In the formulae above and throughout the description, the term "linear alkyl" denotes a linear functional group having from 1 to 10, 3 to 10, or 1 to 6 carbon atoms. In the formulae above and throughout the description, the term "branched alkyl" denotes a linear functional group having from 3 to 10, or 1 to 6 carbon atoms. Exemplary linear alkyl groups include, but are not limited to, methyl, ethyl, propyl, butyl, pentyl, and hexyl groups. Exemplary branched alkyl groups include, but are not limited to, isopropyl, isobutyl, sec-butyl, tert-butyl ($Bu^t$), iso-pentyl, tert-pentyl (amyl), isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and through the description, the term "halide" denotes a chloride, bromide, iodide, or fluoride ion.

In the formulae above and throughout the description, the term "cyclic alkyl" denotes a cyclic group having from 3 to 10 or 5 to 10 atoms. Exemplary cyclic alkyl groups include, but are not limited to, cyclobutyl, cyclopentyl, cyclohexyl, and cyclooctyl groups. In certain embodiments, the cyclic alkyl group may have one or more $C_1$ to $C_{10}$ linear, branched substituents, or substituents containing oxygen or nitrogen atoms. In this or other embodiments, the cyclic alkyl group may have one or more linear or branched alkyls or alkoxy groups as substituents, such as, for example, a methylcyclohexyl group or a methoxycyclohexyl group.

In the formulae above and throughout the description, the term "aryl" denotes an aromatic cyclic functional group having from 3 to 10 carbon atoms, from 5 to 10 carbon atoms, or from 6 to 10 carbon atoms. Exemplary aryl groups include, but are not limited to, phenyl, benzyl, chlorobenzyl, tolyl, and o-xylyl.

In the formulae above and throughout the description, the term "alkenyl group" denotes a group which has one or more carbon-carbon double bonds and has from 2 to 12, from 2 to 10, or from 2 to 6 carbon atoms. Exemplary alkenyl groups include, but are not limited to, vinyl or allyl groups.

The term "alkynyl group" denotes a group which has one or more carbon-carbon triple bonds and has from 2 to 12 or from 2 to 6 carbon atoms.

In the formulae and throughout the description, the term "dialkylamino group" denotes a group which has two alkyl groups attached to a nitrogen atom and has from 1 to 10 or from 2 to 6 or from 2 to 4 carbon atoms.

The term "good leaving group" or "hydrocarbon leaving group" as used herein describes a hydrocarbon group bonded to a nitrogen atom that can be easily broken to form a stable hydrocarbon radical during deposition process, thus resulting in a silicon nitride or silicon oxide film having less carbon content (e.g., a carbon content less than about 1 at % or less). The stability of hydrocarbon radicals is vinyl radical>benzyl radical>tert-butyl radical>iso-propyl radical>methyl radical. Examples of good leaving groups or substituents include, but are not limited to, tert-butyl or tert-amyl groups both of which are better leaving group than iso-propyl. In certain embodiments of Formulae I or II, R is selected from a tert-butyl or tert-amyl group.

The term "electron withdrawing group" as used herein describes an atom or group thereof that acts to draw electrons away from the Si—N bond. Examples of suitable electron withdrawing groups or substituents include, but are not limited to, nitriles (CN). In certain embodiments, electron withdrawing substituent can be adjacent to or proximal to N in any one of Formula I. Further non-limiting examples of an electron withdrawing group includes F, Cl, Br, I, CN, $NO_2$, RSO, and/or $RSO_2$ wherein R can be a $C_1$ to $C_{10}$ alkyl group such as, but not limited to, a methyl group or another group.

In the formulae above and through the description, the term "unsaturated" as used herein means that the functional group, substituent, ring or bridge has one or more carbon double or triple bonds. An example of an unsaturated ring can be, without limitation, an aromatic ring such as a phenyl ring. The term "saturated" means that the functional group, substituent, ring or bridge does not have one or more double or triple bonds.

In certain embodiments, one or more of the alkyl group, alkenyl group, alkynyl group, aryl group, and/or cyclic alkyl group in the formulae may be "substituted" or have one or more atoms or group of atoms substituted in place of, for example, a hydrogen atom. Exemplary substituents include, but are not limited to, oxygen, sulfur, halogen atoms (e.g., F, Cl, I, or Br), nitrogen, alkyl groups, and phosphorous. In other embodiments, one or more of the alkyl group, alkenyl group, alkynyl group, aromatic and/or aryl group in the formulae may be unsubstituted.

In certain embodiments, any one or more of substituents $R^1$, $R^2$, $R^3$ and $R^4$ in the formulae described above can be linked with a C—C bond in the above formula to form a ring structure when they are not hydrogen. As the skilled person will understand, the substituent may be selected from a linear or branched $C_1$ to $C_{10}$ alkylene moiety; a $C_2$ to $C_{12}$ alkenylene moiety; a $C_2$ to $C_{12}$ alkynylene moiety; a $C_4$ to $C_{10}$ cyclic alkyl moiety; and a $C_6$ to $C_{10}$ arylene moiety. In these embodiments, the ring structure can be unsaturated such as, for example, a cyclic alkyl ring, or saturated, for example, an aryl ring. Further, in these embodiments, the ring structure can also be substituted or substituted. In other embodiments, any one or more of substituents $R^1$, $R^2$ and $R^3$ are not linked.

In embodiments wherein the precursor compound comprises a compound having Formula I, examples of precursors include those that are shown below in the following Table 1.

TABLE 1

| Precursors having Formula I |
|---|

1,3-bis(tert-butyl)cyclodisilazane 1,3-bis(tert-amyl)cyclodisilazane 1,3-bis(tert-butyl)-2-methylcyclodisilazane TABLE 1-continued

| Precursors having Formula I |
|---|

1,3-bis(tert-butyl)-2,4-dimethylcyclodisilazane

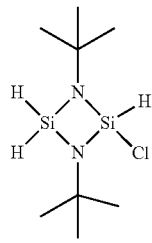

1,3-bis(tert-butyl)-2-chlorocyclodisilazane

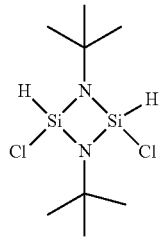

1,3-bis(tert-butyl)-2,4-dichlorocyclodisilazane 1,3-bis(tert-amyl)cyclodisilazane

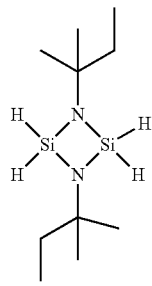

1,3-bis(tert-amyl)-2-methyl-cyclodisilazane

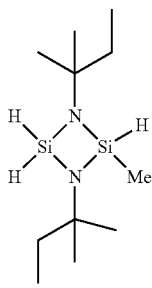

TABLE 1-continued

Precursors having Formula I

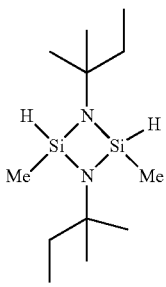 [SMILES: CCC(C)(C)N1[SiH](C)N(C(C)(C)CC)[SiH]1C]

1,3-bis(tert-amyl)-2,4-dimethyl-cyclodisilazane

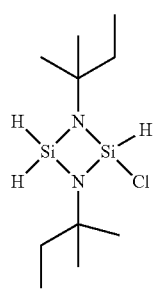

1,3-bis(tert-amyl)-2-chloro-cyclodisilazane

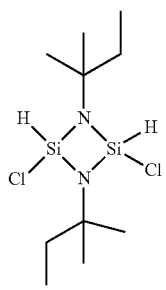 [SMILES: CCC(C)(C)N1[SiH](Cl)N(C(C)(C)CC)[SiH]1Cl]

1,3-bis(tert-amyl)-2,4-dichloro-cyclodisilazane

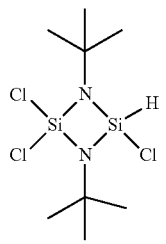

1,3-bis(tert-butyl)-2,2,4-trichloro-cyclodisilazane

In embodiments wherein the precursor compound comprises a compound having Formula II, examples of precursors include those that are shown below in the following Table 2.

TABLE 2

Precursors having Formula II

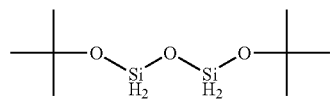

1,3-bis(tert-butoxy)disiloxane

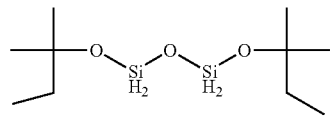

1,3-bis(tert-pentoxy)disiloxane

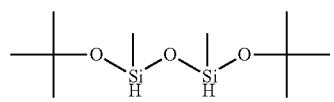

1,3-bis(tert-butoxy)-1,3-dimethyldisiloxane

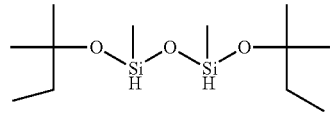

1,3-bis(tert-pentoxy)-1,3-dimethyldisiloxane

Examples of compounds having the above formulae include, without limitation, 1,3-bis(tert-butyl)cyclodisilazane and 1,3-bis(tert-butyl)-2-methylcyclodisilazane. Without wishing to be bound by any theory or explanation, it is believed that the tert-butyl groups within the molecule can be more readily removed by a remote plasma during the deposition process because tert-butyl radical is the most stable radical. Further the later molecule, 1,3-bis(tert-butyl)-2-methylcyclodisilazane, has a relatively lower melting point of below zero. Importantly, both of these compounds provide a 1:1 Si/N ratio. 1,3-bis(tert-butoxy)disiloxane can be used for flowable silicon oxide deposition, taking the advantage of existing O—Si—O—Si linkage which can promote further formation of solid silicon-containing films due to tert-butyl is a better leaving group as more stable radical than methyl group.

The silicon precursor compounds described herein may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The deposition can be performed using either direct plasma or remote plasma source. For the remote plasma source, a dual plenum showerhead can be used to prevent premixing between the vapors of the silicon precursors and radicals inside showerhead and thus avoid generating particles. Teflon coating can be executed to maximize the radical lifetime and radical transmission The silicon precursor compounds are preferably substantially free of halide ions such as chloride or metal ions such as aluminum, iron, nickel, chromium. As used herein, the term "substantially free" as it relates to halide ions (or halides) such as, for example, chlorides and fluorides, bromides, iodides, $Al^{3+}$ ions, $Fe^{2+}$, $Fe^{3+}$, $Ni^{2+}$, $Cr^{3+}$ means less than 10 ppm (by weight), or less than 5 ppm (by weight), preferably less than 3 ppm, and more preferably less than 1 ppm, and most preferably 0 ppm (e.g., greater than about 0 ppm to less than about 1 ppm). Chlorides or metal ions are known to act as decomposition catalysts for silicon precursors. Significant levels of chloride in the final product can cause the silicon precursors to degrade. The gradual degradation of the silicon precursors may directly impact the film deposition process making it difficult for the semiconductor manufacturer to meet film specifications. In addition, the shelf-life or stability is negatively impacted by the higher degradation rate of the silicon precursors thereby making it difficult to guarantee a 1-2 year shelf-life. Moreover, some of silicon precursors are known to form flammable and/or pyrophoric gases upon decomposition such as hydrogen and silane. Therefore, the accelerated decomposition of the silicon precursors presents safety and performance concerns related to the formation of these flammable and/or pyrophoric gaseous byproducts.

Compositions according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodisilanes, bromodisilanes, or iododisilanes thereby avoiding the production of by-products that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and, may include, but are not limited to purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO$—$Al_2O_3$ blends can be used to remove halides such as chloride.

For those embodiments relating to a composition comprising a solvent(s) and at least one compound described herein, the solvent or mixture thereof selected does not react with the silicon compound. The amount of solvent by weight percentage in the composition ranges from 0.5% by weight to 99.5% or from 10% by weight to 75%. In this or other embodiments, the solvent has a boiling point (b.p.) similar to the b.p. of the precursors of Formulae I and II or the difference between the b.p. of the solvent and the b.p. of the silicon precursor precursors of Formula II is 40° C. or less, 30° C. or less, or 20° C. or less, 10° C. or less, or 5° C. or less. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or $10^0$ to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

The method used to form the films or coatings described herein are flowable chemical deposition processes. Examples of suitable deposition processes for the method disclosed herein include, but are not limited to, thermal chemical vapor deposition (CVD) or plasma enhanced cyclic CVD (PECCVD) process. As used herein, the term "flowable chemical vapor deposition processes" refers to any process wherein a substrate is exposed to one or more volatile precursors, which react and/or decompose on the substrate surface to provide flowable oligomeric silicon-containing species and then produce the solid film or material upon further treatment. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the films are deposited using a plasma-based (e.g., remote generated or in situ) CVD process. The term "reactor" as used herein, includes without limitation, a reaction chamber or deposition chamber.

In certain embodiments, the substrate may be exposed to one or more pre-deposition treatments such as, but not limited to, a plasma treatment, thermal treatment, chemical treatment, ultraviolet light exposure, electron beam exposure, and combinations thereof to affect one or more properties of the films. These pre-deposition treatments may occur under an atmosphere selected from inert, oxidizing, and/or reducing.

Energy is applied to the at least one of the compound, nitrogen-containing source, oxygen source, other precursors or combination thereof to induce reaction and to form the silicon-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof.

In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

As previously mentioned, the method deposits a film upon at least a portion of the surface of a substrate comprising a surface feature. The substrate is placed into the reactor and the substrate is maintained at one or more temperatures ranging from about −20° C. to about 400° C. In one particular embodiment, the temperature of the substrate is less than the walls of the chamber. The substrate temperature is held at a temperature below 100° C., preferably at a temperature below 25° C. and most preferably below 10° C. and greater than −20° C.

As previously mentioned, the substrate comprises one or more surface features. In one particular embodiment, the surface feature(s) have a width of 100 μm or less, 1 μm in width or less, or 0.5 μm in width. In this or other embodiments, the aspect ratio (the depth to width ratio) of the surface features, if present, is 0.1:1 or greater, or 1:1 or greater, or 10:1 or greater, or 20:1 or greater, or 40:1 or greater. The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

In certain embodiments, the reactor is at a pressure below atmospheric pressure or 750 torr (105 Pascals (Pa)) or less, or 100 torr (13332 Pa) or less. In other embodiments, the pressure of the reactor is maintained at a range of about 0.1 torr (13 Pa) to about 10 torr (1333 Pa).

In one particular embodiment, the introducing step, wherein the at least one compound and nitrogen source is introduced into the reactor, is conducted at one or more temperatures ranging from −20 to 1000° C., or from about 400° C. to about 1000° C., or from about 400° C. to about 600° C., 450° C. to about 600° C., or from about −20° C. to about 400° C. In these or other embodiments, the substrate comprises a semiconductor substrate comprising a surface feature. The nitrogen-containing source can be selected from the group consisting of ammonia, hydrazine, monoalkylhydrazine, dialkylhydrazine, nitrogen, nitrogen plasma, nitrogen/hydrogen plasma, nitrogen/helium plasma, nitrogen/argon plasma, ammonia/helium plasma, ammonia/argon plasma, ammonia/nitrogen plasma, NF$_3$, NF$_3$ plasma, organic amine plasma, and mixtures thereof. The at least one compound and nitrogen source react and form a silicon nitride film (which is non-stoichiometric) on at least a portion of the surface feature and substrate.

In another embodiment, silicon oxide films or carbon doped silicon oxide films can be deposited by delivering the precursor with an oxygen-containing source. The oxygen-containing source can be selected from the group consisting of water (H$_2$O), oxygen (O$_2$), oxygen plasma, ozone (O$_3$), NO, N$_2$O, carbon monoxide (CO), carbon dioxide (CO$_2$), N$_2$O plasma, carbon monoxide (CO) plasma, carbon dioxide (CO$_2$) plasma, and combinations thereof.

In one particular embodiment, the method for depositing a silicon oxide or a carbon-doped silicon oxide film in a flowable chemical vapor deposition process comprises:
  placing a substrate having a surface feature into a reactor which are maintained at a temperature ranging from −20° C. to about 400° C.;
  introducing into the reactor at least one compound selected from the group consisting of Formulae I or II below:

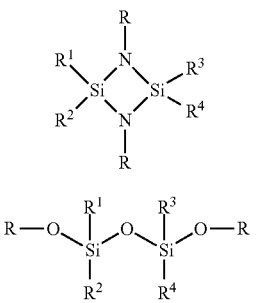

wherein R is selected from a branched C$_4$ to C$_{10}$ alkyl group and R$^1$, R$^2$, R$^3$, R$^4$ are each independently selected from a hydrogen atom, a linear C$_1$ to C$_{10}$ alkyl group, a branched C$_3$ to C$_{10}$ alkyl group, a linear or branched C$_2$ to C$_6$ alkenyl group, a linear or branched C$_2$ to C$_6$ alkynyl group, a C$_1$ to C$_6$ dialkylamino group, a C$_6$ to C$_{10}$ aryl group, an electron withdrawing group, a C$_3$ to C$_{10}$ cyclic alkyl group, and a halide atom; and/or
  treating the substrate with an oxygen source at one or more temperatures ranging from about 100° C. to about 1000° C. to form the silicon oxide film on at least a portion of the surface feature to provide the silicon oxide film. Alternatively, the film may be exposed to an oxygen source while being exposed to UV irradiation at temperatures ranging from about 100° C. to about 1000° C. The process steps can be repeated until the features are filled with the high quality silicon oxide film in order to reduce film shrinkage.

In a further embodiment of the method described herein, the film is deposited using a flowable CVD process. In this embodiment, the method comprises:
  placing one or more substrates comprising a surface feature into a reactor which is heated to a temperature ranging from −20° C. to about 400° C. and maintained at a pressure of 100 torr or less;
  introducing at least one compound selected from the group consisting of Formulae I or II below:

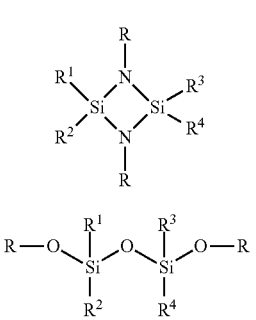

wherein R is selected from a branched C$_4$ to C$_{10}$ alkyl group and R$^1$, R$^2$, R$^3$, R$^4$ are each independently selected from a hydrogen atom, a linear C$_1$ to C$_{10}$ alkyl group, a branched C$_3$ to C$_{10}$ alkyl group, a linear or branched C$_2$ to C$_6$ alkenyl group, a linear or branched C$_2$ to C$_6$ alkynyl group, a C$_1$ to C$_6$ dialkylamino group, a C$_6$ to C$_{10}$ aryl group, an electron withdrawing group, a C$_3$ to C$_{10}$ cyclic alkyl group, and a halide atom;
  providing an oxygen source into the reactor to react with the at least one compound to form a film and cover at least a portion of the surface feature;

annealing the film at one or more temperatures of about 100° C. to 1000° C., preferably 100° to 400° C. to allow the silicon-containing films to coat at least a portion of the surface feature. The oxygen source of this embodiment is selected from the group consisting of water vapors, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof. The process can be repeated until the surface features are filled with the silicon-containing film. When water vapors are employed as oxygen source in this embodiment, the substrate temperatures are preferably between −20 and 40° C., most preferably between −10 and 25° C.

In yet a further embodiment of the method described herein, a silicon-containing film selected from the group consisting of a silicon nitride, a carbon-doped silicon nitride, a silicon oxynitride, and a carbon-doped silicon oxynitride film, is deposited using a flowable plasma enhanced CVD process. In this embodiment, the method comprises:

placing one or more comprising a surface feature into a reactor which is heated to a temperature ranging from −20° C. to about 400° C. and maintained at a pressure of 100 torr or less;

introducing at least one compound selected from the group consisting of Formulae I or II below:

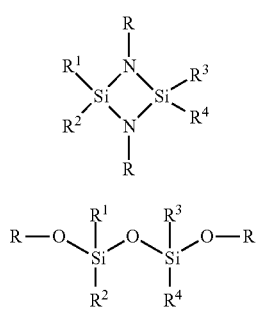

wherein R is selected from a branched $C_4$ to $C_{10}$ alkyl group and $R^1$, $R^2$, $R^3$, $R^4$ are each independently selected from a hydrogen atom, a linear $C_1$ to $C_{10}$ alkyl group, a branched $C_3$ to $C_{10}$ alkyl group, a linear or branched $C_2$ to $C_6$ alkenyl group, a linear or branched $C_2$ to $C_6$ alkynyl group, a $C_1$ to $C_6$ dialkylamino group, a $C_6$ to $C_{10}$ aryl group, an electron withdrawing group, a $C_3$ to $C_{10}$ cyclic alkyl group, and a halide atom;

providing a plasma source into the reactor to react with the compound to form a coating on at least a portion of the surface features; and annealing the coating at one or more temperatures ranging from about 100° C. to 1000° C., or from about 100° to 400° C., to form a silicon-containing film on at least a portion of the surface features. The plasma for this embodiment is selected from the group consisting of a nitrogen plasma; plasma comprising nitrogen and helium; a plasma comprising nitrogen and argon; an ammonia plasma; a plasma comprising ammonia and helium; a plasma comprising ammonia and argon; helium plasma; argon plasma; hydrogen plasma; a plasma comprising hydrogen and helium; a plasma comprising hydrogen and argon; a plasma comprising ammonia and hydrogen; an organic amine plasma; and mixtures thereof. For flowable plasma enhanced CVD, the process can be repeated several times until the vias or trenches are filled with densified film(s).

The above steps define one cycle for the methods described herein; and the cycle can be repeated until the desired thickness of a silicon-containing film is obtained. In this or other embodiments, it is understood that the steps of the methods described herein may be performed in a variety of orders, may be performed sequentially or concurrently (e.g., during at least a portion of another step), and any combination thereof. The respective step of supplying the compounds and other reagents may be performed by varying the duration of the time for supplying them to change the stoichiometric composition of the resulting silicon-containing film.

In certain embodiments, the resultant silicon-containing films or coatings can be exposed to a post-deposition treatment such as, but not limited to, a plasma treatment, chemical treatment, ultraviolet light exposure, Infrared exposure, electron beam exposure, and/or other treatments to affect one or more properties of the film.

Throughout the description, the term "organic amine" as used herein describes an organic compound that has at least one nitrogen atom. Examples of organoamine, but are not limited to, methylamine, ethylamine, propylamine, iso-propylamine, tert-butylamine, sec-butylamine, tert-amylamine, ethylenediamine, dimethylamine, trimethylamine, diethylamine, pyrrole, 2,6-dimethylpiperidine, di-n-propylamine, di-iso-propylamine, ethylmethylamine, N-methylaniline, pyridine, and triethylamine.

Throughout the description, the term "alkyl hydrocarbon" refers a linear or branched $C_6$ to $C_{20}$ hydrocarbon, cyclic $C_6$ to $C_{20}$ hydrocarbon. Exemplary hydrocarbon includes, but not limited to, hexane, heptane, octane, nonane, decane, dodecane, cyclooctane, cyclononane, cyclodecane.

Throughout the description, the term "aromatic hydrocarbon" refers a $C_6$ to $C_{20}$ aromatic hydrocarbon. Exemplary aromatic hydrocarbon n includes, but not limited to, toluene, mesitylene.

Throughout the description, the term "silicon nitride" as used herein refers to a film comprising silicon and nitrogen selected from the group consisting of stoichiometric or non-stoichiometric silicon nitride, silicon carbonitride (carbon doped silicon nitride), silicon carboxynitride, and their mixture thereof.

Throughout the description, the term "silicon oxide" as used herein refers to a film comprising silicon and oxygen selected from the group consisting of stoichiometric or non-stoichiometric silicon oxide, carbon doped silicon oxide, silicon carboxynitride and there mixture thereof. An example of the silicon containing or silicon nitride film that is formed using the silicon precursors having Formulae I or II and processes described herein has the formulation $Si_xO_yC_zN_vH_w$ wherein Si ranges from about 10% to about 50%; O ranges from about 0% to about 70%; C ranges from about 0% to about 40%; N ranges from about 10% to about 75% or from about 10% to 60%; and H ranges from about 0% to about 10% atomic percent weight % wherein x+y+z+v+w=100 atomic weight percent, as determined for example, by x-ray photoelectron spectroscopy (XPS) or secondary ion mass spectrometry (SIMS).

Throughout the description, the term "features" as used herein refers to a semiconductor substrate or partially fabricated semiconductor substrate having vial, trenches etc.

The following Examples are provided to illustrate certain aspects of the invention and shall not limit the scope of the appended claims.

WORKING EXAMPLES

General Deposition Conditions

The flowable chemical vapor deposited (FCVD) films were deposited onto medium resistivity (8-12 Ωcm) single crystal silicon wafer substrates and Si pattern wafers. For the pattern wafers, the preferred pattern width is 50~100 nm with the aspect ratio of 5:1~20:1.

The depositions were performed on a modified FCVD chamber on an Applied Materials Precision 5000 system, using a dual plenum showerhead. The chamber was equipped with direct liquid injection (DLI) delivery capability. The precursors were liquids with delivery temperatures dependent on the precursor's boiling point. To deposit the initial flowable nitride films, typical liquid precursor flow rates ranged from about 100 to about 5000 mg/min, and the chamber pressure ranged from about 0.75-12 Torr. Particularly, the remote power was provided by MKS microwave generator from 0 to 3000 W with the frequency of 2.455 GHz, operating from 2 to 8 Torr. Some of the films were deposited with an in situ plasma with the power density at 0.25-3.5 $W/cm^2$ and pressure at 0.75-12 Torr. To densify the as-deposit flowable films, the films were thermally annealed and/or UV cured in vacuum using the modified PECVD chamber at 100~1000° C., preferably 300~400° C. UV curing was provided by using a Fusion UV system with the H+ bulb. The max power of the UV system is 6000 W.

In some embodiments, to convert the initially deposited, flowable nitride into oxide, the films were exposed to an oxygen source comprising ozone at a temperature ranging from about 25° C. to about 300° C. The deposited films were densified by thermal annealing and UV curing at 25~400° C.

In other embodiments, to convert the initial flowable oxide films into high quality oxide films, the films were treated by $O_3$ exposure or $O_2$ plasma from room temperature to 400° C. and UV cure.

The above steps define on cycle for the flowable process. The cycle was repeated until the desired thickness of the film was obtained. Thickness and refractive index (RI) at 632 nm were measured by a SCI reflectometer or Woollam ellipsometer. The typical film thickness ranged from about 10 to about 2000 nm. Bonding properties hydrogen content (Si—H, C—H and N—H) of the silicon-based films were measured and analyzed by a Nicolet transmission Fourier transform infrared spectroscopy (FTIR) tool. All density measurements were accomplished using X-ray reflectivity (XRR). X-ray Photoelectron Spectroscopy (XPS) and Secondary ion mass spectrometry (SIMS) analysis were performed to determine the elemental composition of the films. Wet etch rate (WER) was measured in 100:1 dilute HF solutions. A mercury probe was adopted for the electrical properties measurement including dielectric constant, leakage current and breakdown field. The flowability and gap fill effects on an Al patterned wafer were observed by a cross-sectional Scanning Electron Microscopy (SEM) using a Hitachi S-4800 system at a resolution of 2.0 nm.

Example 1: Deposition of Silicon Carbonitride Films Using 1,3-bis(tert-butyl)-2-methylcyclodisilazane (Formula I) with In Situ Plasma In situ flowable CVD depositions were conducted using a design of experiment (DOE) methodology. The experimental design includes: precursor flow from 100 to 5000 mg/min, preferably 1000 to 2000 mg/min; $NH_3$ flow from 100 sccm to 3000 sccm, preferably 500 to 1500 sccm; chamber pressure from 0.75 to 12 Torr, preferably 4 to 8 Torr; in situ plasma power 100 to 1000 W, preferably 150~300 W; and deposition temperature ranged from 0 to 550° C., preferably 0 to 30° C.

A number of SiCN films were deposited using 1,3-bis(tert-butyl)-2-methylcyclodisilazane as a precursor onto 8 inch silicon substrates and patterned substrates to compare the flowability, film density, and wet etch rate.

The most favorable deposition conditions were as follows: 1,3-bis(tert-butyl)-2-methylcyclodisilazane flow=1000-2000 mg/min, $NH_3$ flow=500 sccm, He flow=200 sccm, Pressure=5 torr, plasma power=300~400 W, and Temperature=30~40° C. After thermal annealing at 300° C. for 5 min, bottom-up, seamless, and void-free gap-filling was achieved on pattern wafers by the flowable SiCN films using 1-methyl-N,N'-di-tert-butylcyclodisilazane, as shown in FIG. 1. No voids were seen in the gaps with the depth of 600 nm deep and aspect ratio 10:1.

Example 2: Deposition of Silicon Carbonitride Films Using 1,3-bis(tert-butyl)-2-methylcyclodisilazane (Formula I) with Remote Plasma A number of SiCN films were deposited using 1,3-bis(tert-butyl)-2-methylcyclodisilazane as a precursor and $N_2$, $NH_3$, or $H_2$, or the combination of $N_2$, $NH_3$, $H_2$ as reactant gas onto 8 inch silicon substrates and patterned substrates to compare the flowability, film density, and wet etch rate.

Figure 2:
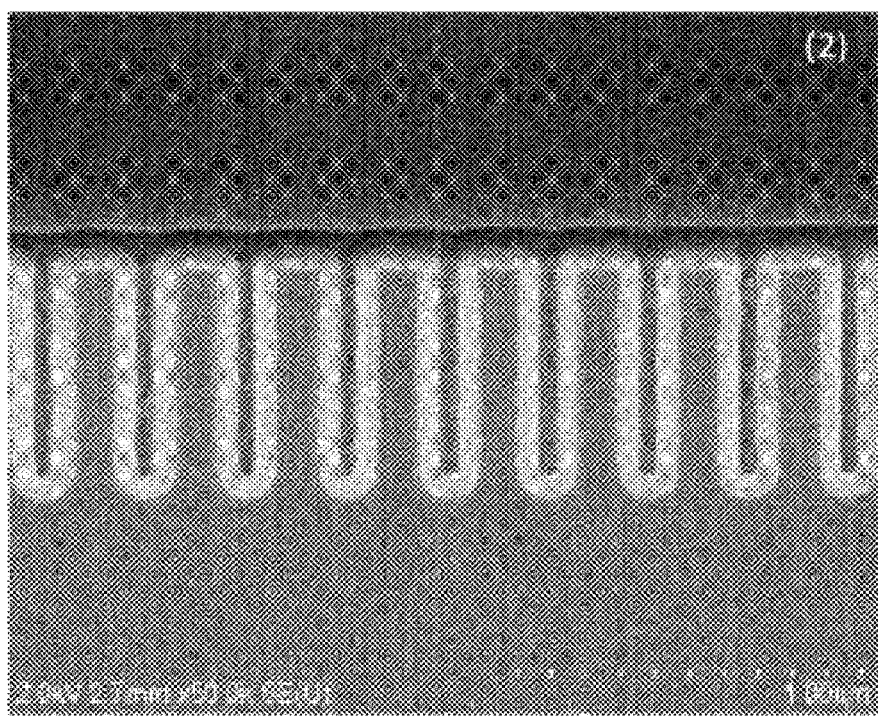
FIG. 2 provides across-sectional, scanning electron microscopy (SEM) image on the silicon carbonitride film deposited in Example 2.

The most favorable deposition conditions included: 1,3-bis(tert-butyl)-2-methylcyclodisilazane flow=1000-2000 mg/min, $NH_3$ (or $N_2$, $H_2$) flow=1500~3000 sccm, He flow=50 sccm, Pressure=0.5~2 torr, remote plasma power=3000 W, and Temperature=10~20° C. After thermal annealing at 300° C. for 5 min, bottom-up, seamless, and void-free gap-filling was achieved on pattern wafers by the flowable SiCN films using 1,3-bis(tert-butyl)-2-methylcyclodisilazane as the precursor and $H_2$ as the reactant gas using remote plasma chemical vapor deposition technique, as shown in FIG. 2. No voids were seen in the gaps with the depth of 600 nm deep and aspect ratio 10:1.

Example 3: Deposition of Silicon Oxide Films Using 1,3-bis(tert-butoxy)-1,3-dimethyldisiloxane with Formula II Using Remote Plasma A number of silicon oxide films were deposited using 1,3-bis(tert-butoxy)-1,3-dimethyldisiloxane as a precursor onto 8 inch silicon substrates and patterned substrates to compare the flowability, film density, and wet etch rate.

Figure 3:
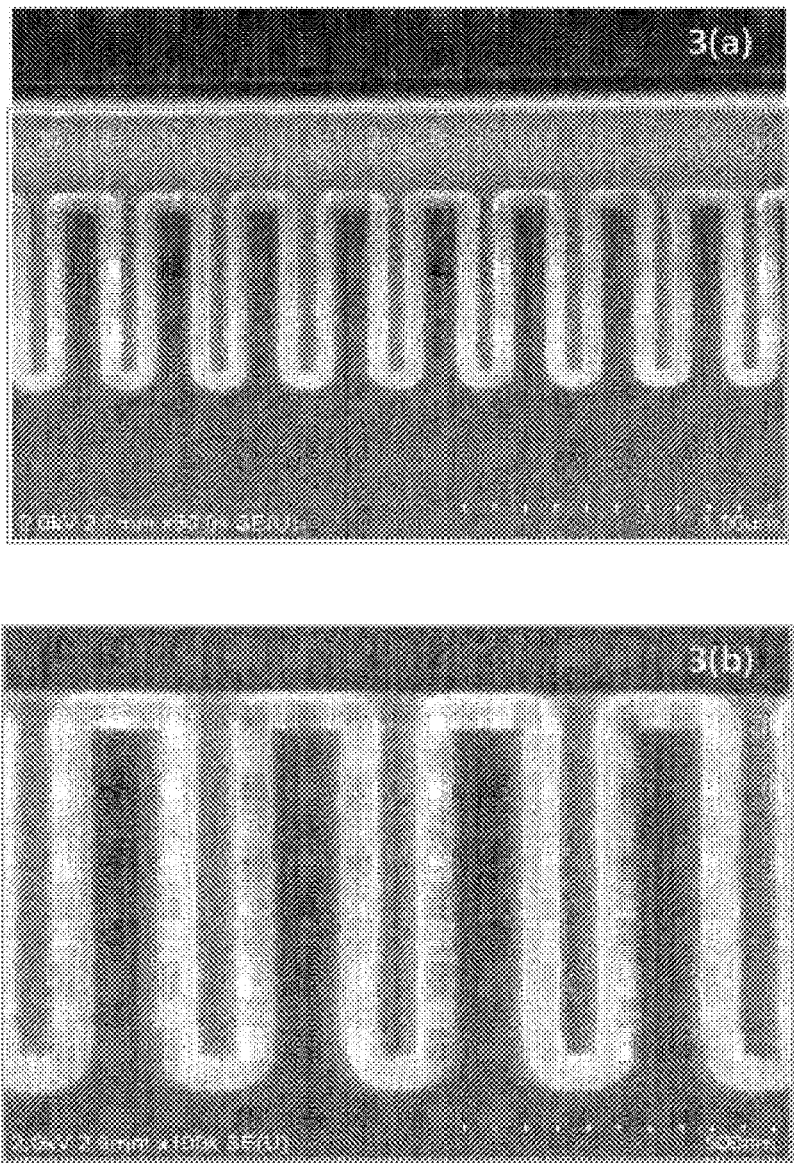
FIGS. 3(a) and (b) provide across-sectional, scanning electron microscopy (SEM) image on the silicon carbon oxide film deposited in Example 3.

The most favorable deposition conditions wereas follows: 1,3-bis(tert-butoxy)-1,3-dimethyldisiloxane flow=2000 mg/min, $O_2$ flow=1500~4500 sccm, He carrier flow=50 sccm, Pressure=0.5~2 Torr, Remote plasma power=3000 W, and Temperature=10~20° C.). Wet and soft films were deposited on the blanket wafers. The as-deposited films were thermally annealed at 300° C. for 5 min and UV cured at 400° C. for 10 min. Bottom-up, seamless, and void-free gap-filling was achieved on pattern wafers by the flowable SiCO films using 1,3-bis(tert-butoxy)-1,3-dimethyldisiloxane and oxygen using remote plasma chemical vapor deposition technique, as shown in FIG. 3(a) and 3 (b). No voids were seen in the gaps with the depth of 600 nm deep and aspect ratio 10:1.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for depositing a silicon oxide film in a flowable chemical vapor deposition process, the method comprising:

placing a substrate having a surface feature into a reactor which are maintained at one or more temperatures ranging from about −20° C. to about 100 and a pressure of the reactor is maintained at 100 torr or less;

introducing into the reactor a mixture comprising a nitrogen source and a cyclodisilazane compound comprising at least one Si-H bond and having a boiling point between about 100° C. and about 200° C.;

wherein the cyclodisilazane compound comprising at least one Si—H bond and having a boiling point between about 100° C. and about 200° C. is 1,3-bis(tert-butyl)-2-methylcyclodisilazane and the 1,3-bis(tert-butyl)-2-methylcyclodisilazane reacts with the nitrogen source to form a nitride containing film on at least a portion of the surface feature at a temperature of about 40° C. or less;

treating the substrate with an oxygen source at one or more temperatures ranging from about 100° C. to about 1000° C. to form the silicon oxide film on at least a portion of the surface feature to provide the film; and wherein the deposition process is a plasma enhanced chemical vapor deposition process and the plasma is generated remotely.

2. The method of claim 1 wherein the nitrogen source is selected from the group consisting of ammonia, hydrazine, monoalkylhydrazine, dialkylhydrazine, nitrogen, nitrogen plasma, a plasma comprising nitrogen and hydrogen, a plasma comprising nitrogen and helium, a plasma comprising nitrogen and argon, ammonia plasma, a plasma comprising ammonia and helium, a plasma comprising ammonia and argon, a plasma comprising ammonia and nitrogen, $NF_3$, $NF_3$ plasma, organic amine plasma, and mixtures thereof.

3. The method of claim 1 wherein the deposition process is a plasma enhanced chemical vapor deposition and the plasma is generated in situ.

4. The method of claim 1 wherein the oxygen source is selected from the group consisting of water ($H_2O$), oxygen ($O_2$), oxygen plasma, ozone ($O_3$), NO, $N_2O$, carbon monoxide (CO), carbon dioxide ($CO_2$), $N_2O$ plasma, carbon monoxide (CO) plasma, carbon dioxide ($CO_2$) plasma, and combinations thereof.

5. The method of claim 1 wherein the film has a wet etch rate and the wet etch rate is less than 2.2 times that of a thermal oxide films in a 100:1 dilute HF solution.

6. The method of claim 1 further comprising: treating the film with at least one selected from plasma, ultraviolet light, infrared light, or combinations thereof.

7. The method of claim 1, wherein the 1,3-bis(tert-butyl)-2-methylcyclodisilazane reacts with the nitrogen source to form a nitride containing film on at least a portion of the surface feature at a temperature of about 10° C. to about 20° C.

* * * * *